(12) United States Patent
Fagg

(10) Patent No.: US 8,902,002 B2
(45) Date of Patent: Dec. 2, 2014

(54) ADAPTIVE BIASING SCHEME FOR AN AMPLIFIER

(75) Inventor: Russell Fagg, Cambridge (GB)

(73) Assignee: Nujira Limited, Cambridge (GB)

(*) Notice: Subject to any disclaimer, the term of this patent is extended or adjusted under 35 U.S.C. 154(b) by 44 days.

(21) Appl. No.: 13/483,166

(22) Filed: May 30, 2012

(65) Prior Publication Data

US 2013/0321085 A1 Dec. 5, 2013

(51) Int. Cl.
*H03G 3/20* (2006.01)

(52) U.S. Cl.
USPC ............ 330/136; 330/127; 330/297; 330/296

(58) Field of Classification Search
USPC .................................. 330/136, 127, 297, 296
See application file for complete search history.

(56) References Cited

U.S. PATENT DOCUMENTS

| | | | | |
|---|---|---|---|---|
| 6,404,823 B1* | 6/2002 | Grange et al. | ................. | 375/297 |
| 7,808,323 B2* | 10/2010 | Takinami et al. | ............. | 330/297 |
| 7,852,150 B1* | 12/2010 | Arknaes-Pedersen | .......... | 330/10 |
| 7,868,696 B2* | 1/2011 | Behzad et al. | ................. | 330/285 |
| 8,472,898 B2* | 6/2013 | Rofougaran | ............... | 455/127.1 |
| 2004/0198271 A1* | 10/2004 | Kang | ......................... | 455/127.1 |

* cited by examiner

*Primary Examiner* — Patricia Nguyen

(74) *Attorney, Agent, or Firm* — Mendelsohn, Drucker, Dunleavy, P.C.; Steve Mendelsohn

(57) ABSTRACT

There is provided a bias arrangement for an amplifier adapted to amplify a varying input signal, the arrangement comprising a control circuit arranged to adaptively vary a bias current to the amplifier in dependence on an envelope of the varying input signal.

11 Claims, 4 Drawing Sheets

ADAPTIVE BIASING SCHEME FOR AN AMPLIFIER

BACKGROUND OF THE INVENTION

1. Field of the Invention

The present invention relates to amplifiers having a biased current input and arranged to amplify a varying input signal. The invention is particularly but not exclusively concerned with transconductance amplifiers in envelope tracking architectures.

2. Description of the Related Art

Frequency domain duplex (FDD) systems include transceivers that have a transmitter and a receiver which operate at different carrier frequencies. A simple exemplary architecture of such an FDD system is illustrated in FIG. 1. A transceiver includes a transmitter block 6 which receives an input signal on line 2 to be transmitted by an antenna 18. A receiver block 8 receives signals that are detected at the antenna 18 and delivers them on signal line 4. The output of the transmitter 6 is delivered to a duplex filter 14 on line 10. The received signal from the antenna 18 is delivered from the duplex filter 14 on a line 12 to the receiver 8. The antenna 18 is connected to the duplex filter 14 via a line 16.

In such an FDD system it is essential that energy from the transmitter does not block the receiver. This may occur because the duplex filter on the output of the transmitter has only limited attenuation. Any noise present at the receiver frequency on the transmitter output due to noise from the transmitter has the potential to cause receiver blocking.

The transmitter circuitry 6 typically includes a transconductance amplifier. A transconductance amplifier generates a current which is proportional to its input voltage. Any noise present at the receiver frequency on the transmitter output due to noise from a transconductance amplifier in the transmitter has the potential to cause the above-mentioned receiver blocking. Any such noise must preferably not be allowed to exceed a low level while the power consumption of the transconductance amplifier is minimised. Thus efficient, low noise, high linearity transconductance amplifiers are required in FDD systems.

A typical transconductance amplifier uses a class A or continuous bias scheme that is independent of the input signal level. In a transmitter incorporating an envelope tracking modulated power supply, a typical transconductance amplifier uses a class A or continuous bias scheme that is independent of the modulation envelope.

With such a bias scheme, the transconductance amplifier consumes the same power and generates the same noise at the signal troughs as it does at the signal peaks.

It is an aim of the invention to control an amplifier, such as a transconductance amplifier, to reduce generated noise and/or reduce consumed power.

SUMMARY OF THE INVENTION

The invention introduces an adaptive biasing scheme, suitable for transconductance amplifiers, and exploits a feature that during signal troughs the bias current can be "backed off". This saves power and reduces noise during the quiet periods of the modulation. The invention may be particularly advantageously applied in a transmitter incorporating an envelope tracking modulated power supply. Extra circuitry is required to implement the adaptive biasing scheme, which increases both the die area and design and verification time. However the invention provides significant benefits, not only in reducing noise during the quiet periods of the modulation, but also by saving power.

Embodiments of the invention provide a bias arrangement for an amplifier adapted to amplify a varying input signal, the arrangement comprising a control circuit arranged to adaptively vary a bias current to the amplifier in dependence on an envelope of the varying input signal.

The bias arrangement may further include a current source for generating the bias current.

The control circuit includes a peak detection circuit may be arranged to track the envelope of the varying input signal and to provide an output which is proportional to the instantaneous magnitude of the varying input signal to the bias modulation circuit for controlling the variation of the bias current. The control circuit may include a bias modulation circuit responsive to the output of the peak detection circuit and arranged to control the current source in dependence thereon.

The bias arrangement may further comprise a common mode detection circuit for detecting a common mode voltage associated with the varying input signal, and a current generator for generating a DC offset current in the bias current in dependence on the detected common mode voltage.

The amplifier is preferably a transconductance amplifier.

An envelope-tracking supply for an amplification stage may include such a transconductance amplifier. A mobile communication handset may include an envelope tracking power supply for a radio frequency amplifier including an amplifier as described. A mobile communication infrastructure device including an envelope tracking power supply for a radio frequency amplifier including an amplifier as described.

In another embodiment a bias arrangement for a transconductance amplifier is arranged to amplify a varying input signal, and comprises: a peak detection circuit arranged to track the envelope of an input signal for the transconductance amplifier and to provide an output which is proportional to the instantaneous magnitude of the input signal; and a bias modulation circuit responsive to the peak detection circuit and arranged to modulate a bias current to the transconductance amplifier in accordance with the envelope of the input signal.

The bias arrangement may further comprise a current source for providing the bias current under the control of the bias modulation circuit.

In embodiments there is provided a method of providing a bias current to an amplifier arranged to amplify a varying input signal, the method comprising varying the bias current in dependence on the envelope of the varying input signal.

The method may further comprise providing an output which is proportional to the instantaneous magnitude of the varying input signal for controlling the variation of the bias current.

The method may further comprise detecting a common mode voltage associated with the varying input signal, and generating a DC offset current in the bias current in dependence on the detected common mode voltage.

The method may be applied to a transconductance amplifier. The method may be applied to the transconductance amplifier of an envelope tracking power supply for a radio frequency amplifier.

BRIEF DESCRIPTION OF THE FIGURES

The invention is now described by way of example with reference to the accompanying figures, in which.

DESCRIPTION OF THE PREFERRED EMBODIMENTS

The invention is now described by way of example with reference to particular embodiments and exemplary implementations. The invention is not limited to the details of any described embodiments or exemplary implementations.

Figure 1:
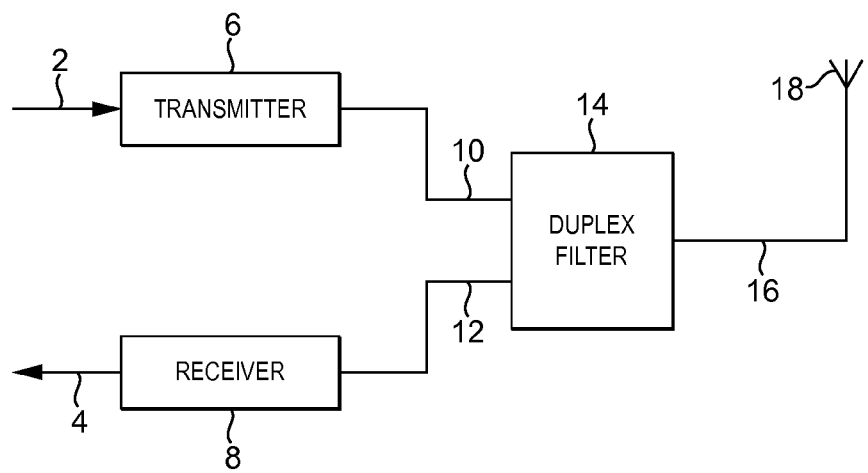
FIG. 1 illustrates an FDD transceiver, in which embodiments of the invention may be implemented.
Figure 2:
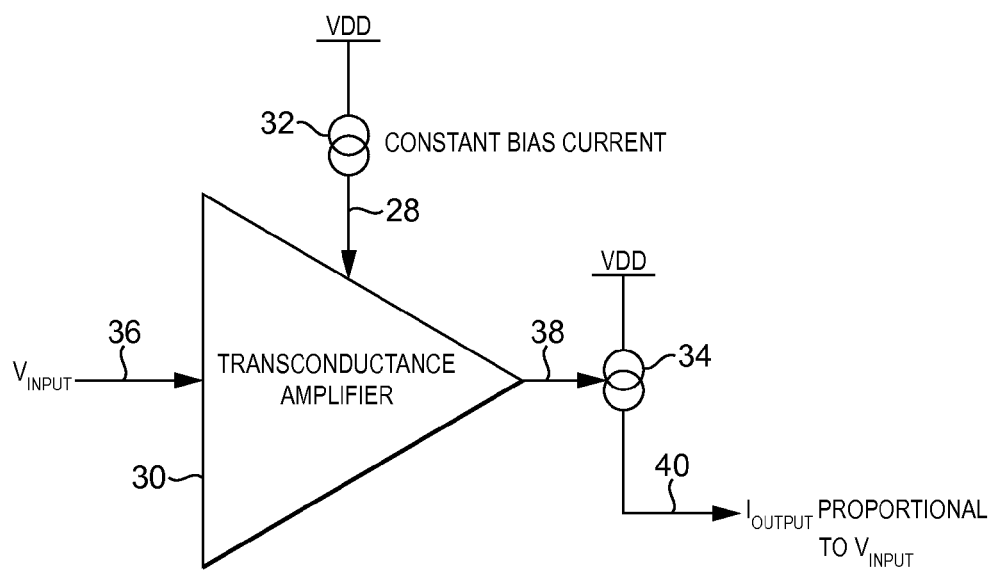
FIG. 2 illustrates a prior art transconductance amplifier with constant bias.

With reference to FIG. 2 there is illustrated an exemplary arrangement of a transconductance amplifier as known in the art, with a constant bias.

As illustrated in FIG. 2 a transconductance amplifier generally designated by reference numeral 30 receives a voltage input signal on line 36, and generates a current control signal on line 38. A current source 32 provides a constant bias current on line 28 to the transconductance amplifier 30. The current control signal on line 38 controls a current source 34. The current source 34 generates a current on a line 40 which is an output current of the transconductance amplifier. The output current on line 40 is proportional to the input voltage on line 36. Each of the current sources 32 and 34 are connected to a supply voltage.

In an arrangement such as illustrated in FIG. 2, the transconductance amplifier's constant bias must be set at a sufficiently high level to ensure that in dependence on overall supply voltage, input signal, and load conditions, the transconductance amplifier can deliver sufficient current to the load without clipping or distortion under all operating conditions.

Figure 3:
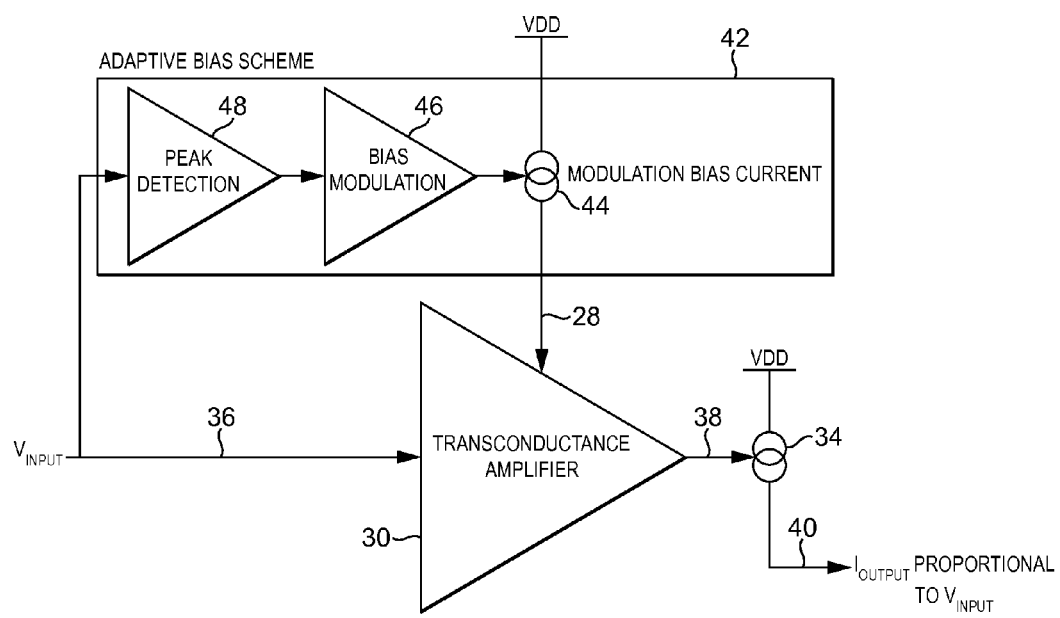
FIG. 3 illustrates a transconductance amplifier with modified bias in accordance with a preferred embodiment of the invention.

FIG. 3 illustrates an improvement to the prior art arrangement of FIG. 2 in accordance with a preferred embodiment of the invention. Where elements of FIG. 3 correspond to elements of FIG. 2 like reference numerals are used.

A control circuit 42 is introduced comprising a peak detection circuit 48, a bias modulation circuit 46, and a current source 44 which generates a modulated bias current. The peak detection circuit 48 receives the voltage input signal on line 36 as an input, and the current source 44 generates a variable bias current on line 28 to the transconductance amplifier 30. The current source 44 is additionally connected to the supply voltage.

The purpose of the peak detection circuit 48 is to accurately track the peaks of the envelope of the input signal on line 36, and to provide an output that is proportional to the instantaneous magnitude of the peaks of this input signal.

The purpose of the bias modulation circuit 46 is to compensate for excess noise or distortion resulting from the peak detection circuit 48.

The bias modulation circuit 46 modulates the transconductance amplifiers bias current, by controlling the current source 44, in accordance with the input signal envelope. For small input signals the bias current will be minimised, and for larger input signals sufficient bias will be provided for the transconductance amplifier to accurately track the signal peaks.

The peak detection circuit 48 and the bias modulation circuit 46 are preferably designed to track the process, temperature and voltage effects of the transconductance amplifier. In one example, the transconductance of the transconductance amplifier is inversely proportional to resistance, therefore, if the bias varies proportional to resistance then a constant transconductance is obtained.

The adaptive biasing technique provided by the control circuit 42 of FIG. 3 allows the power consumption of a transconductance amplifier for use in a transmitter, or other application, to be minimised such that only the current required to convey the modulation is consumed. By minimising current consumption, the noise of the transconductance amplifier is also minimised. This allows the area of the transconductance amplifier to be reduced for a given noise budget, such as to meet a receiver blocking requirement as described.

Figure 4:
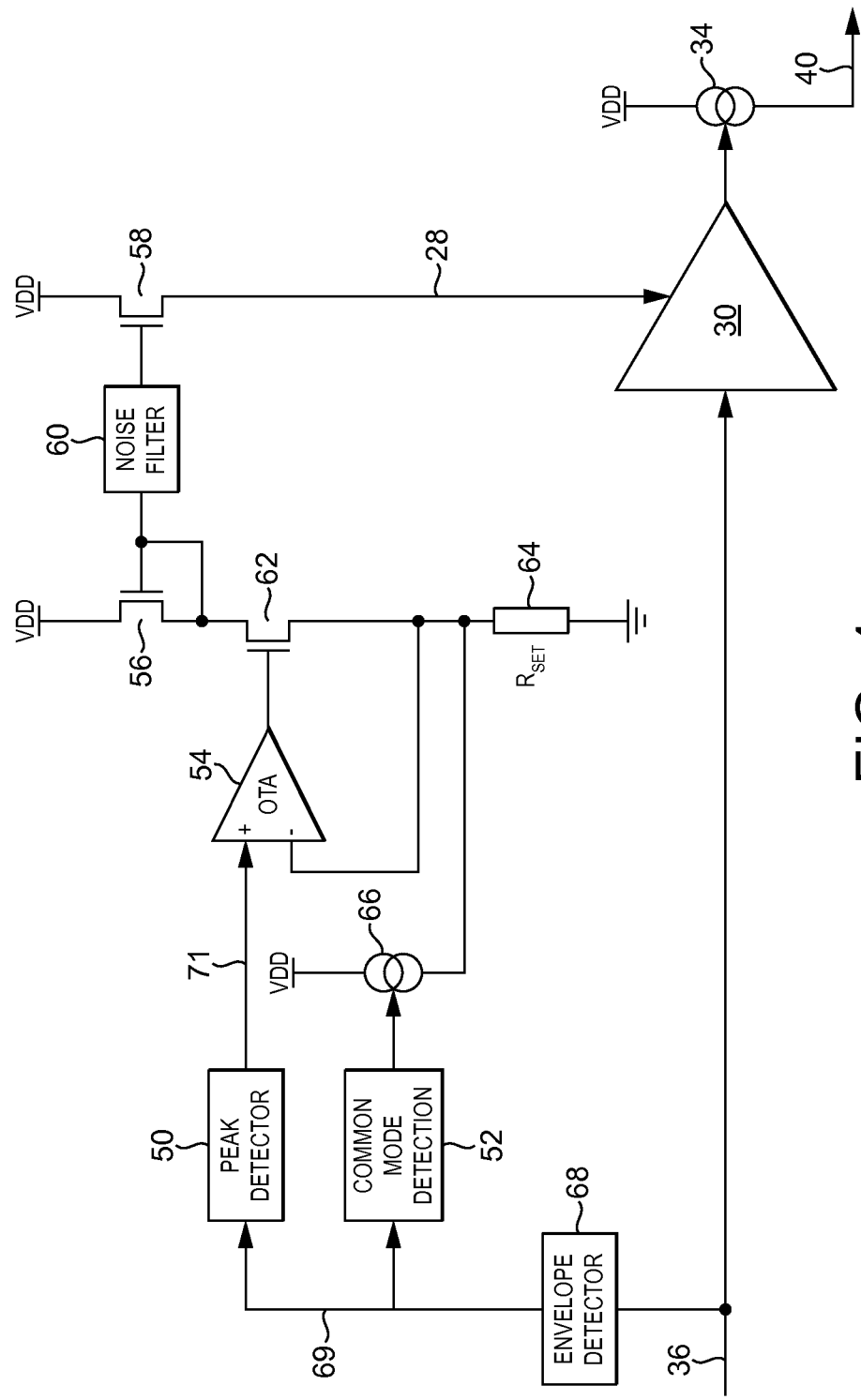
FIG. 4 illustrates an exemplary implementation of the modified bias in accordance with the invention.

With reference to FIG. 4 there is illustrated an exemplary implementation of the control circuit 42 of FIG. 3. Where elements of FIG. 4 correspond to elements of FIG. 3 like reference numerals are used.

The input voltage on line 36 is provided to an envelope detector 68 which generates an envelope signal on line 69. The envelope signal is input to a peak detector circuit 50 which corresponds to the peak detection circuit 48 of FIG. 3. The output of the peak detector 50 on line 71 is a waveform which follows the peaks of the envelope signal on line 69.

The output of the peak detector 50 on line 71 forms an input to the non-inverting input of an operational transconductance amplifier 54. The output of the operational transconductance amplifier 54 is connected to the gate of a transistor 62. The source of the transistor 62 is fed back to the inverting input of the operational transconductance amplifier 54. The source of the transistor 62 is additionally connected to one terminal of a resistor 64, having a value $R_{set}$, which has a second terminal connected to electrical ground.

The operational transconductance amplifier 54, the transistor 62, and the resistor 64 operate to force the voltage at the non-inverting input of the amplifier 54 (which is the voltage of the output of the peak detector 50) to be present at the source of the transistor 62 and the first terminal of the resistor 64. This converts the voltage signal of the output of the peak detector 50 on line 71 into the current domain.

This current flows in the drain of the transistor 62, which is connected to the source of a further transistor 56, and the transistor 56 has its drain connected to the supply voltage $V_{DD}$. The transistor 56 is diode connected, and has its gate connected to a further transistor 58, preferably via a noise filter 60 as shown in FIG. 4.

The transistor 58 is an implementation of the modulated bias current source 44 of FIG. 3. Thus the drain of the transistor 58 is connected to the supply voltage $V_{DD}$, and the source of the transistor 58 is connected via line 28 to the supply terminal of the transconductance amplifier 30.

The current flowing in the drain of transistor 62, which is the current corresponding to the voltage output by the peak detector circuit 50, is mirrored by the current mirror configuration arrangement of transistors 56 and 58 to flow in the transistor 58.

In a preferred embodiment, a common mode detection circuit 52 is additionally provided in the implementation. As illustrated in FIG. 4, the common mode detection circuit 52 receives the envelope signal on line 69 as an input. The common mode detection circuit 52 is illustrated as generating a control signal which controls a current source 66, which is connected between the supply voltage $V_{DD}$ and the connection point between the first terminal of the resistor 64 and the source of the transistor 62. It should be noted that the illustration of the current source 66 is exemplary only, and in alternative arrangements a current sink and/or a current sink in combination with a current source may be provided.

The purpose of the common mode detection circuit 52 and current source 66 is to inject a current into the node between the source of the transistor 62 and the first terminal of the resistor 64 to meet a desired objective for the DC bias current in the supply to the transconductance amplifier. In the illustration of FIG. 4, the common mode detection circuit determines the common mode voltage in the envelope signal on line 69, and adjusts the current injected from the current source 66 in dependence thereon. In the example illustrated in FIG. 4 the current source may be used to inject a current in order to eliminate a DC offset current. In alternative arrangements a current sink may be used in order to generate a DC offset current.

Figure 5:
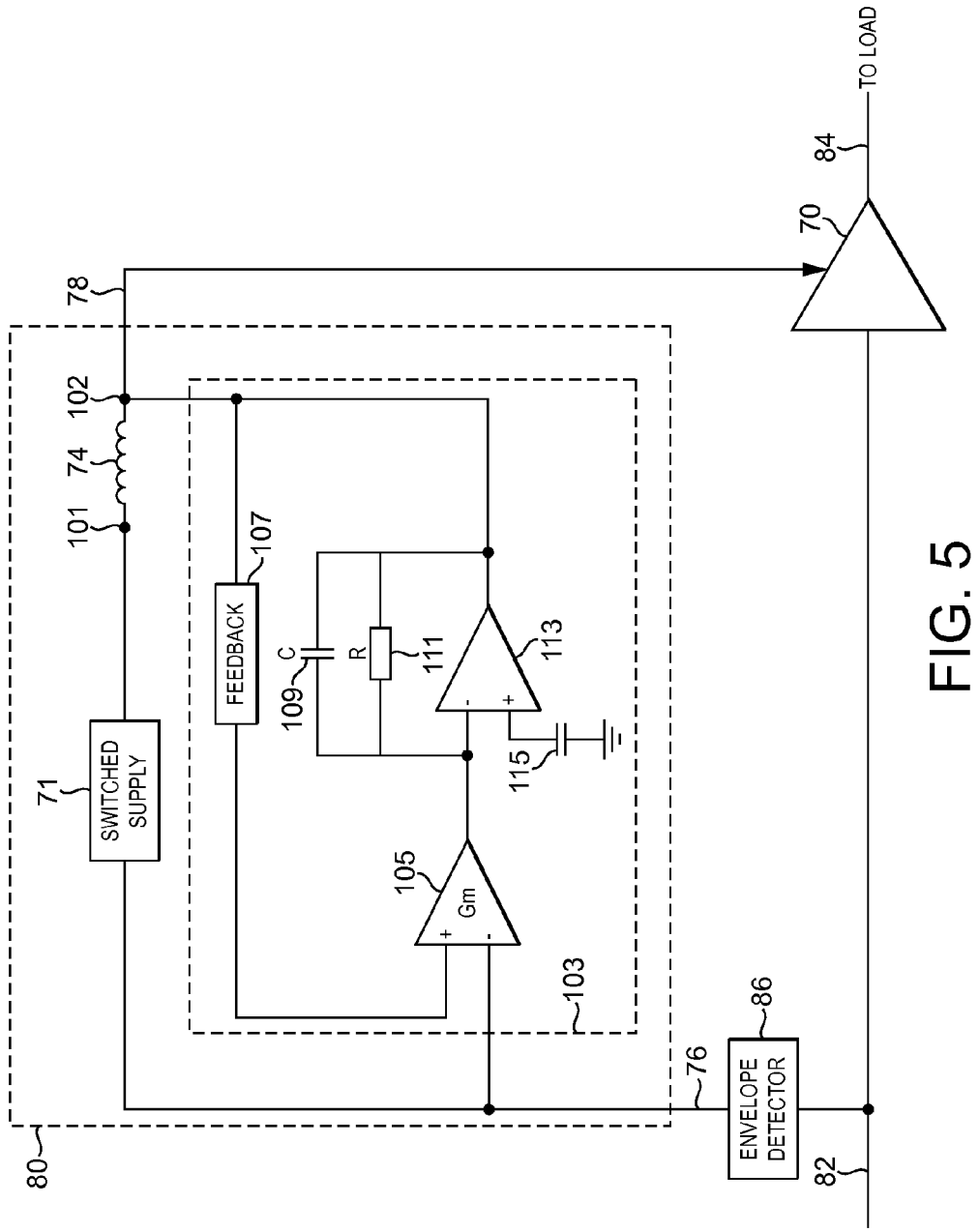
FIG. 5 illustrates an exemplary application of a transconductance amplifier in accordance with an embodiment of the invention.

With reference to FIG. 5, there is illustrated an example implementation of a transconductance amplifier such as transconductance amplifier 30 of FIGS. 3 and 4, in which the modifications according to the present invention may be implemented.

FIG. 5 illustrates an RF power amplifier 70 with an envelope tracking modulated power supply 80. An RF input signal on line 82 is amplified by the RF amplifier 70 to provide an amplified RF output signal on line 84, which is delivered to a load such as an RF antenna.

An envelope detector 86 additionally receives the RF input signal on line 82 and generates an envelope signal on line 76 representing the envelope of the input signal to be amplified. This forms the input to the envelope tracking power supply 80.

One of a plurality of available voltage levels is selected in a switched supply circuit 71 in dependence upon the envelope signal on line 76, and the selected switched supply voltage is connected to a first terminal 101 of an inductor 74.

A correction amplifier arrangement generally designated by reference numeral 103 additionally receives the envelope signal on line 76. The correction amplifier arrangement comprises, in the illustrative arrangement, a transconductance amplifier 105, an amplifier 113, a resistor 111, a capacitor 109, a battery 115 and a feedback stage 107. The correction amplifier arrangement 103 is merely illustrative of an exemplary implementation, and one skilled in the art will appreciate that alternative implementation are possible to provide a correction to the voltage generated by the switched supply 71.

With reference to the correction amplifier arrangement 103, the transconductance amplifier 105 receives the envelope signal on line 76 at its inverting input, and receives an output supply voltage on line 78 from the second terminal 102 of the inductor 74 at its non-inverting terminal, via the feedback stage 107. The transconductance amplifier may be implemented in accordance with the above-described advantageous techniques in accordance with the invention.

The output of the amplifier 105, which is a voltage-to-current transconductance amplifier, is connected to the inverting input of amplifier 113. The non-inverting input of amplifier 113 is connected to the battery 115, the other terminal of which is connected to electrical ground. The battery 115 represents a fixed voltage.

The output of the amplifier 113 is connected to the second terminal 102 of the inductor 74. The capacitor 109 and the resistor 111 are each connected, in parallel, between the input and output of the amplifier 113.

The correction amplifier arrangement 103 operates to compare the output supply voltage at the output of the inductor 74 with the envelope signal on line 76, which provides a reference, and generate an error signal which indicates an error in the output signal to thereby correct the signal. Thus the voltage signal on line 78 is the selected switched supply voltage corrected by the correction amplifier arrangement 103, and is delivered as the supply voltage for the RF amplifier 70.

The amplifier 105 may be implemented as a transconductance amplifier having control circuitry in accordance with the invention and embodiments as described herein.

An RF amplifier arrangement such as illustrated in FIG. 5, with an envelope tracking power supply, may be utilised in various applications, such as in transmitters of mobile communication handsets and mobile communication infrastructure devices.

Although the invention has been described herein with reference to its application to a transconductance amplifier, the invention may be more broadly applicable to any amplifier for which a varying input signal is provided, and where there is a need to adapt the bias current of the amplifier to achieve optimum gain efficiency.

Low noise, power efficient transconductance amplifiers are required in transceiver circuits and precision digital to analog converters and analog to digital converters, as well as other mixed signal applications. The invention may be advantageously implemented in any such applications.

The invention has been described herein with reference to particular advantageous embodiments and exemplary implementations. The invention is not limited to any details of any aspects of such embodiments and implementations. The scope of the invention is defined by the appended claims.

The invention claimed is:

1. A bias arrangement for an amplifier adapted to amplify a varying input signal, the arrangement comprising:
    a control circuit arranged to adaptively vary a bias current to the amplifier in dependence on an envelope of the varying input signal;
    a common mode detection circuit for detecting a common mode voltage associated with the varying input signal; and
    a current generator for generating a DC offset current in the bias current in dependence on the detected common mode voltage.

2. The bias arrangement of claim 1 further including a current source for generating the bias current.

3. The bias arrangement of claim 1 wherein the control circuit includes a peak detection circuit arranged to track the envelope of the varying input signal and to provide an output which is proportional to the instantaneous magnitude of the varying input signal to the bias modulation circuit for controlling the variation of the bias current.

4. The bias arrangement of claim 3 wherein the control circuit includes a bias modulation circuit responsive to the output of the peak detection circuit and arranged to control the current source in dependence thereon.

5. An envelope-tracking supply for an amplification stage including a bias arrangement for a transconductance amplifier adapted to amplify a varying input signal, the arrangement comprising:
    a control circuit arranged to adaptively vary a bias current to the amplifier in dependence on an envelope of the varying input signal.

6. A mobile communication handset including an envelope tracking power supply for a radio frequency amplifier including an amplifier according to claim 1.

7. A mobile communication infrastructure device including an envelope tracking power supply for a radio frequency amplifier including an amplifier according to claim 1.

8. A method of providing a bias current to an amplifier arranged to amplify a varying input signal, the method comprising:

varying the bias current in dependence on the envelope of the varying input signal;

detecting a common mode voltage associated with the varying input signal; and generating a DC offset current in the bias current in dependence on the detected common mode voltage.

9. A method according to claim 8 further comprising providing an output which is proportional to the instantaneous magnitude of the varying input signal for controlling the variation of the bias current.

10. The method according to claim 8 applied to a transconductance amplifier.

11. The method according to claim 8 applied to the transconductance amplifier of an envelope tracking power supply for a radio frequency amplifier.

* * * * *